US012563821B2

(12) United States Patent
Huang et al.

(10) Patent No.: US 12,563,821 B2
(45) Date of Patent: Feb. 24, 2026

(54) SEMICONDUCTOR DEVICE AND FABRICATING METHOD THEREOF

(71) Applicant: Taiwan Semiconductor Manufacturing Co., Ltd., Hsinchu (TW)

(72) Inventors: Cheng-Chien Huang, Hsinchu (TW); Chi-Wen Liu, Hsinchu (TW); Horng-Huei Tseng, Hsinchu (TW); Tsung-Yu Chiang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 853 days.

(21) Appl. No.: 17/327,071

(22) Filed: May 21, 2021

(65) Prior Publication Data

US 2021/0280575 A1 Sep. 9, 2021

Related U.S. Application Data

(60) Continuation of application No. 16/037,467, filed on Jul. 17, 2018, now Pat. No. 11,018,131, which is a
(Continued)

(51) Int. Cl.
*H10D 84/80* (2025.01)
*H01L 21/306* (2006.01)
(Continued)

(52) U.S. Cl.
CPC ..... *H10D 84/811* (2025.01); *H01L 21/30604* (2013.01); *H01L 21/76224* (2013.01); *H01L 23/528* (2013.01); *H10D 1/474* (2025.01);

*H10D 30/0243* (2025.01); *H10D 30/62* (2025.01); *H10D 62/103* (2025.01);
(Continued)

(58) Field of Classification Search
CPC ............. H01L 27/0629; H01L 27/1211; H01L 28/20–26; H01L 21/823821; H01L 21/823431; H01L 21/845; H01L 29/66795–66818; H01L 29/785–7856
See application file for complete search history.

(56) References Cited

U.S. PATENT DOCUMENTS 7,838,429 B2 * 11/2010 Phan ........................ H01L 28/20
438/704
8,697,515 B2 4/2014 Yin et al.
(Continued)

FOREIGN PATENT DOCUMENTS

CN 103474397 A 12/2013
KR 1020150030599 A 3/2015
(Continued)

*Primary Examiner* — Bryan R Junge
(74) *Attorney, Agent, or Firm* — Slater Matsil, LLP

(57) ABSTRACT

A semiconductor device includes a FinFET component, a plurality of patterned dummy semiconductor fins arranged aside a plurality of fins of the FinFET component, an isolation structure formed on the patterned dummy semiconductor fins, and a tuning component formed on the patterned dummy semiconductor fins and electrically connected to the FinFET component. A height of the patterned dummy semiconductor fins is shorter than that of the fins of the FinFET component.

20 Claims, 13 Drawing Sheets

Related U.S. Application Data division of application No. 14/990,603, filed on Jan. 7, 2016, now Pat. No. 10,050,030.

(60) Provisional application No. 62/214,776, filed on Sep. 4, 2015.

(51) Int. Cl.

| | |
|---|---|
| *H01L 21/762* | (2006.01) |
| *H01L 23/528* | (2006.01) |
| *H10D 1/47* | (2025.01) |
| *H10D 30/01* | (2025.01) |
| *H10D 30/62* | (2025.01) |
| *H10D 62/10* | (2025.01) |
| *H10D 64/27* | (2025.01) |
| *H10D 84/01* | (2025.01) |
| *H10D 84/03* | (2025.01) |
| *H10D 84/83* | (2025.01) |

(52) U.S. Cl.

CPC ......... *H10D 62/116* (2025.01); *H10D 64/514* (2025.01); *H10D 84/0151* (2025.01); *H10D 84/0167* (2025.01); *H10D 84/017* (2025.01); *H10D 84/0193* (2025.01); *H10D 84/038* (2025.01); *H10D 84/834* (2025.01); *H10D 84/0128* (2025.01); *H10D 84/013* (2025.01); *H10D 84/0158* (2025.01)

(56) References Cited

U.S. PATENT DOCUMENTS

| | | | |
|---|---|---|---|
| 8,835,268 B2 | 9/2014 | Sudo | |
| 9,397,099 B1 | 7/2016 | Huang | |
| 9,515,184 B2 | 12/2016 | Chiang et al. | |
| 9,530,868 B2 | 12/2016 | Huang et al. | |
| 9,659,810 B2 | 5/2017 | Yin et al. | |
| 9,679,819 B1 | 6/2017 | Tung | |
| 2005/0199948 A1 | 9/2005 | Lee et al. | |
| 2013/0065326 A1 | 3/2013 | Sudo | |
| 2013/0277720 A1 | 10/2013 | Kim et al. | |
| 2013/0309838 A1 | 11/2013 | Wei et al. | |
| 2013/0330889 A1 | 12/2013 | Yin et al. | |
| 2014/0117454 A1 | 5/2014 | Liu et al. | |
| 2014/0131776 A1 | 5/2014 | Ching et al. | |
| 2014/0197456 A1 | 7/2014 | Wang et al. | |
| 2014/0308785 A1* | 10/2014 | Yeh | H01L 27/0629 438/238 |
| 2015/0069528 A1* | 3/2015 | Chiang | H01L 29/1033 438/700 |
| 2015/0147874 A1* | 5/2015 | Huang | H10D 30/62 438/514 |
| 2015/0206954 A1 | 7/2015 | Lin | |
| 2015/0255335 A1* | 9/2015 | Beasor | H01L 28/24 438/666 |
| 2015/0325572 A1* | 11/2015 | Cheng | H01L 21/76224 438/210 |
| 2015/0333057 A1* | 11/2015 | Hoentschel | H01L 21/823431 257/379 |
| 2016/0005866 A1 | 1/2016 | Wu et al. | |
| 2016/0020148 A1* | 1/2016 | Song | H01L 23/5228 438/238 |
| 2016/0064327 A1* | 3/2016 | Lin | H01L 21/76897 257/770 |
| 2016/0204100 A1* | 7/2016 | Zhang | H01L 29/66795 438/210 |
| 2016/0204103 A1* | 7/2016 | Hung | H01L 27/0647 257/536 |
| 2016/0225761 A1 | 8/2016 | Huang | |
| 2017/0033194 A1* | 2/2017 | Chen | H10D 30/0243 |

FOREIGN PATENT DOCUMENTS

| | | |
|---|---|---|
| TW | 201417301 A | 5/2014 |
| TW | 201419545 A | 5/2014 |
| TW | 201428976 A | 7/2014 |

* cited by examiner

SEMICONDUCTOR DEVICE AND FABRICATING METHOD THEREOF

PRIORITY CLAIM AND CROSS-REFERENCE

This application is a continuation of U.S. application Ser. No. 16/037,467, filed on Jul. 17, 2018, now U.S. Pat. No. 11,018,131, issued on May 25, 2021, which is a divisional of U.S. application Ser. No. 14/990,603, filed on Jan. 7, 2016, now U.S. Pat. No. 10,050,030, issued on Aug. 14, 2018, which claims the benefit of U.S. Provisional Application No. 62/214,776, filed on Sep. 4, 2015, which applications are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation.

The smaller feature size is the use of multigate devices such as fin field effect transistor (FinFET) devices. FinFETs are so called because a gate is formed on and around a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
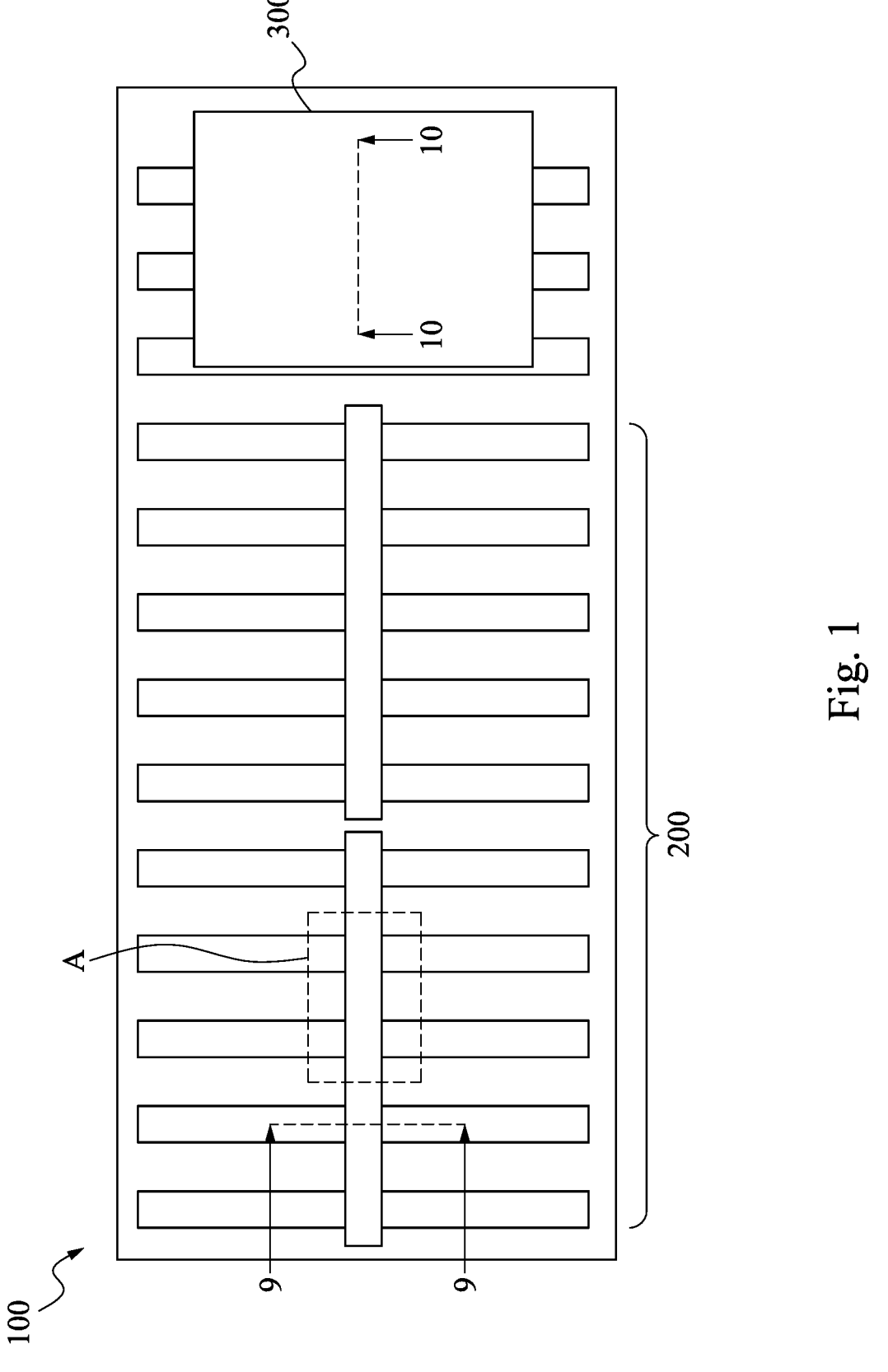
FIG. 1 is a schematic top view of a semiconductor device, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic top view of a semiconductor device, in accordance with some embodiments of the disclosure. The semiconductor device 100 of the present disclosure includes a FinFET component 200 and a tuning component 300. The FinFET component 200 includes a plurality of fins and at least one gate electrode. The fins have high aspect ratio, and the channel and source/drain regions are formed in the fins. The gate electrode is formed crossing the fins. The FinFET component 200 can be utilized in a memory cell and include a plurality of inverters, such as a plurality of N-type inverter and a plurality of P-type inverter alternately arranged. The tuning component 300 including a high-resistance layer is electrically connected to the FinFET component 200 for tuning the threshold voltage of the FinFET component 200.

FIG. 2 to FIG. 7 illustrate a method for manufacturing the FinFET component of the semiconductor device at various stages, in accordance with some embodiments of the present disclosure, in which FIG. 2 to FIG. 7 are local perspective views of the region A of the FinFET component in FIG. 1.

Figure 2:
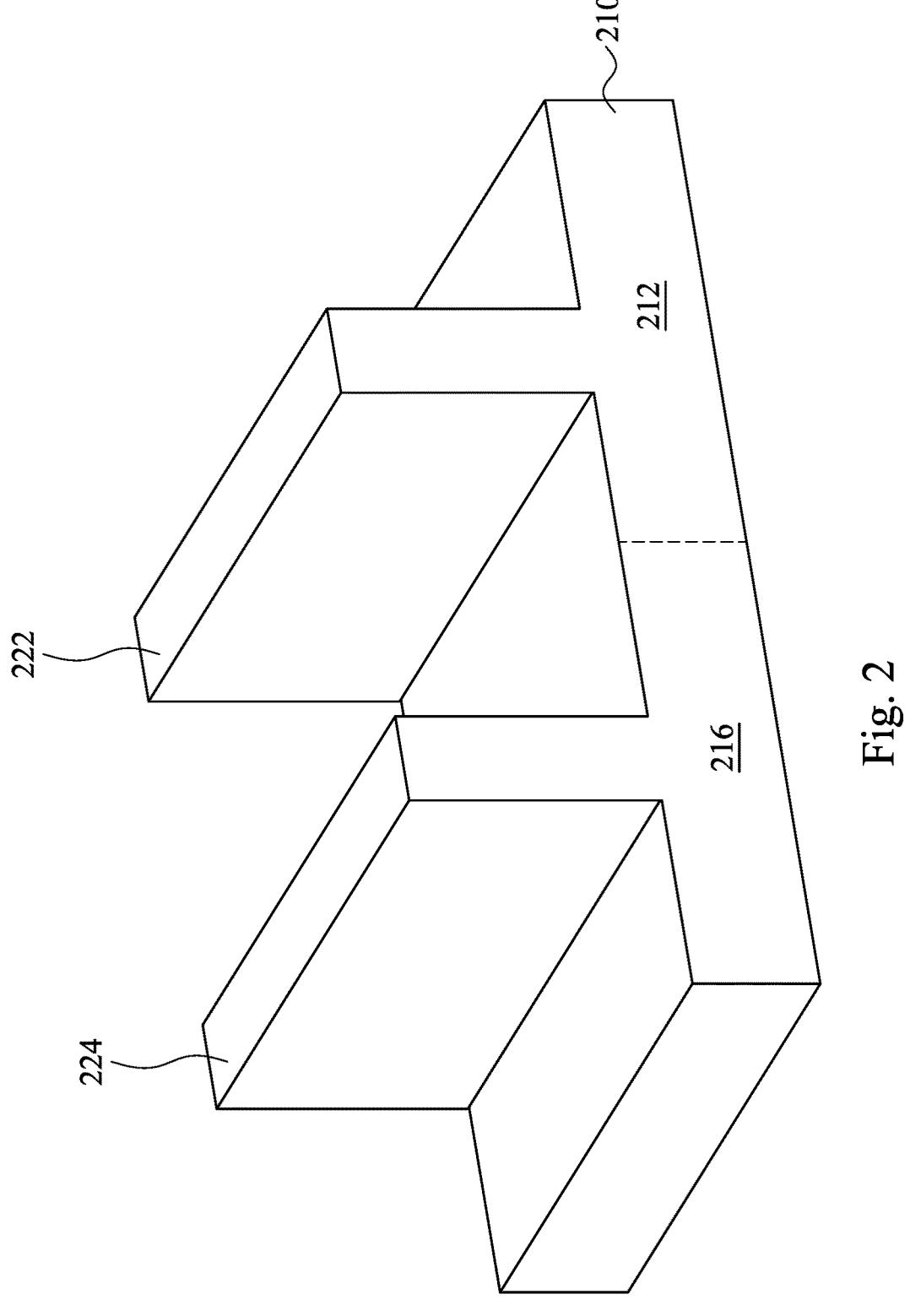
FIG. 2 to FIG. 7 illustrate a method for manufacturing the FinFET component of the semiconductor device at various stages, in accordance with some embodiments of the present disclosure.

Reference is made to FIG. 2. A substrate 210 is provided. In some embodiments, the substrate 210 may be a semiconductor material and may include known structures including a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

A plurality of p-well regions 216 and a plurality of n-well regions 212 are formed in the substrate 210. One of the n-well regions 212 is formed between two of the p-well regions 216. The p-well regions 216 are implanted with P dopant material, such as boron ions, and the n-well regions 212 are implanted with N dopant material such as arsenic ions. During the implantation of the p-well regions 216, the n-well regions 212 are covered with masks (such as photoresist), and during implantation of the n-well regions 212, the p-well regions 216 are covered with masks (such as photoresist).

A plurality of semiconductor fins 222, 224 are formed on the substrate 210. The semiconductor fins 222 are formed on the p-well regions 216, and the semiconductor fins 224 are formed on the n-well regions 212. In some embodiments, the semiconductor fins 222, 224 include silicon. It is note that the number of the semiconductor fins 222, 224 in FIG. 2 is illustrative, and should not limit the claimed scope of the present disclosure. A person having ordinary skill in the art may select suitable number for the semiconductor fins 222, 224 according to actual situations.

The semiconductor fins 222, 224 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 222, 224 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Figure 3:
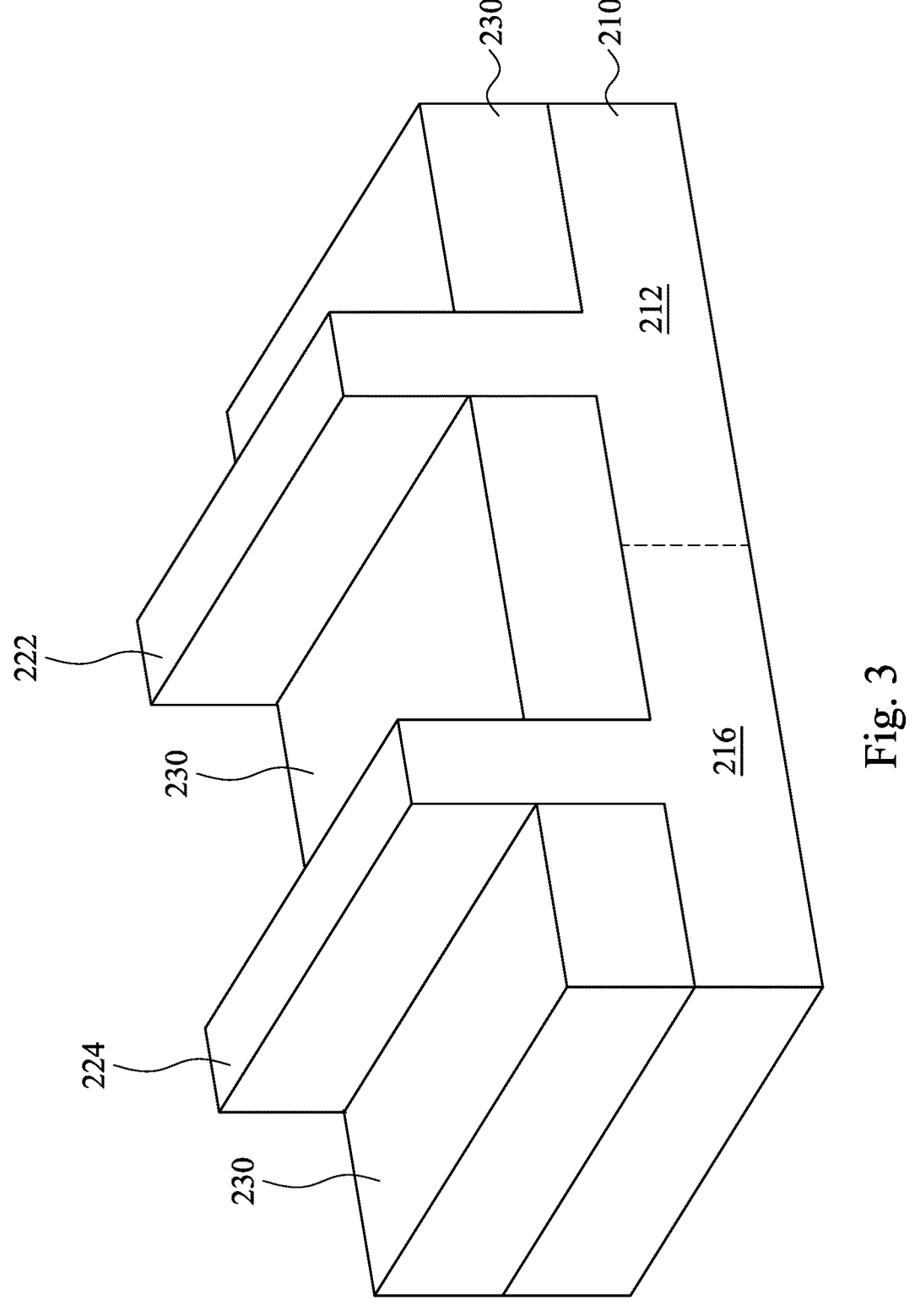

Reference is made to FIG. 3. A plurality of isolation structures 230 are formed on the substrate 210. The isolation structures 230, which act as a shallow trench isolation (STI) around the semiconductor fins 222, 224 may be formed by chemical vapor deposition (CVD) techniques using tetra-ethyl-ortho-silicate (TEOS) and oxygen as a precursor. In yet some other embodiments, the isolation structures 230 are insulator layers of a SOI wafer.

Figure 4:
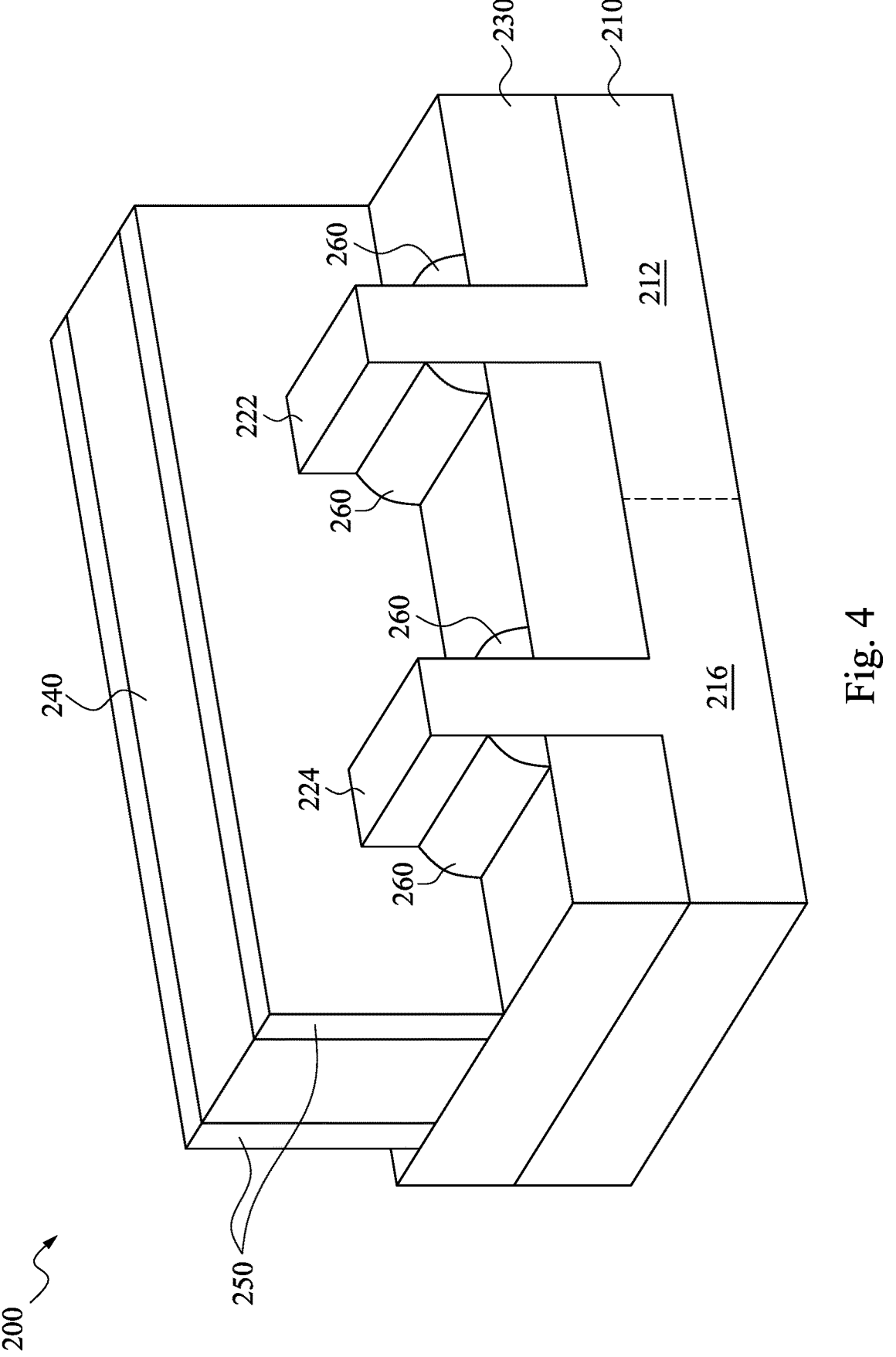

Reference is made to FIG. 4. At least one dummy gate 240 is formed on portions of the semiconductor fins 222, 224 and exposes another portions of the semiconductor fins 222, 224. The dummy gate 240 may be formed crossing multiple semiconductor fins 222, 224.

As shown in FIG. 4, a plurality of gate spacers 250 are formed over the substrate 210 and along the side of the dummy gate 240. In some embodiments, the gate spacers 250 may include silicon oxide, silicon nitride, silicon oxy-nitride, or other suitable material. The gate spacers 250 may include a single layer or multilayer structure. A blanket layer of the gate spacers 250 may be formed by CVD, PVD, ALD, or other suitable technique. Then, an anisotropic etching is performed on the blanket layer to form a pair of the gate spacers 250 on two sides of the dummy gate 240. In some embodiments, the gate spacers 250 are used to offset subsequently formed doped regions, such as source/drain regions. The gate spacers 250 may further be used for designing or modifying the source/drain region (junction) profile.

A plurality of dielectric fin sidewall structures 260 are formed on opposite sides of the semiconductor fins 222, 224. The dielectric fin sidewall structures 260 are formed along the semiconductor fins 222, 224. The dielectric fin sidewall structures 260 may include a dielectric material such as silicon oxide. Alternatively, the dielectric fin sidewall structures 260 may include silicon nitride, SiC, SiON, or combinations thereof. The formation methods for the dielectric fin sidewall structures 260 may include depositing a dielectric material over the semiconductor fins 222, 224, and then anisotropically etching back the dielectric material. The etching back process may include a multiple-step etching to gain etch selectivity, flexibility and desired overetch control.

In some embodiments, the gate spacers 250 and the dielectric fin sidewall structures 260 may be formed in the same manufacturing process. For example, a blanket layer of dielectric layer may be formed to cover the dummy gate 240 and the semiconductor fins 222, 224 by CVD, PVD, ALD, or other suitable technique. Then, an etching process is performed on the blanket layer to form the gate spacers 250 on opposite sides of the dummy gate 240 and form the dielectric fin sidewall structures 260 on opposite sides of the semiconductor fins 222, 224. However, in some other embodiments, the gate spacers 250 and the dielectric fin sidewall structures 260 can be formed in different manufacturing processes.

Figure 5:
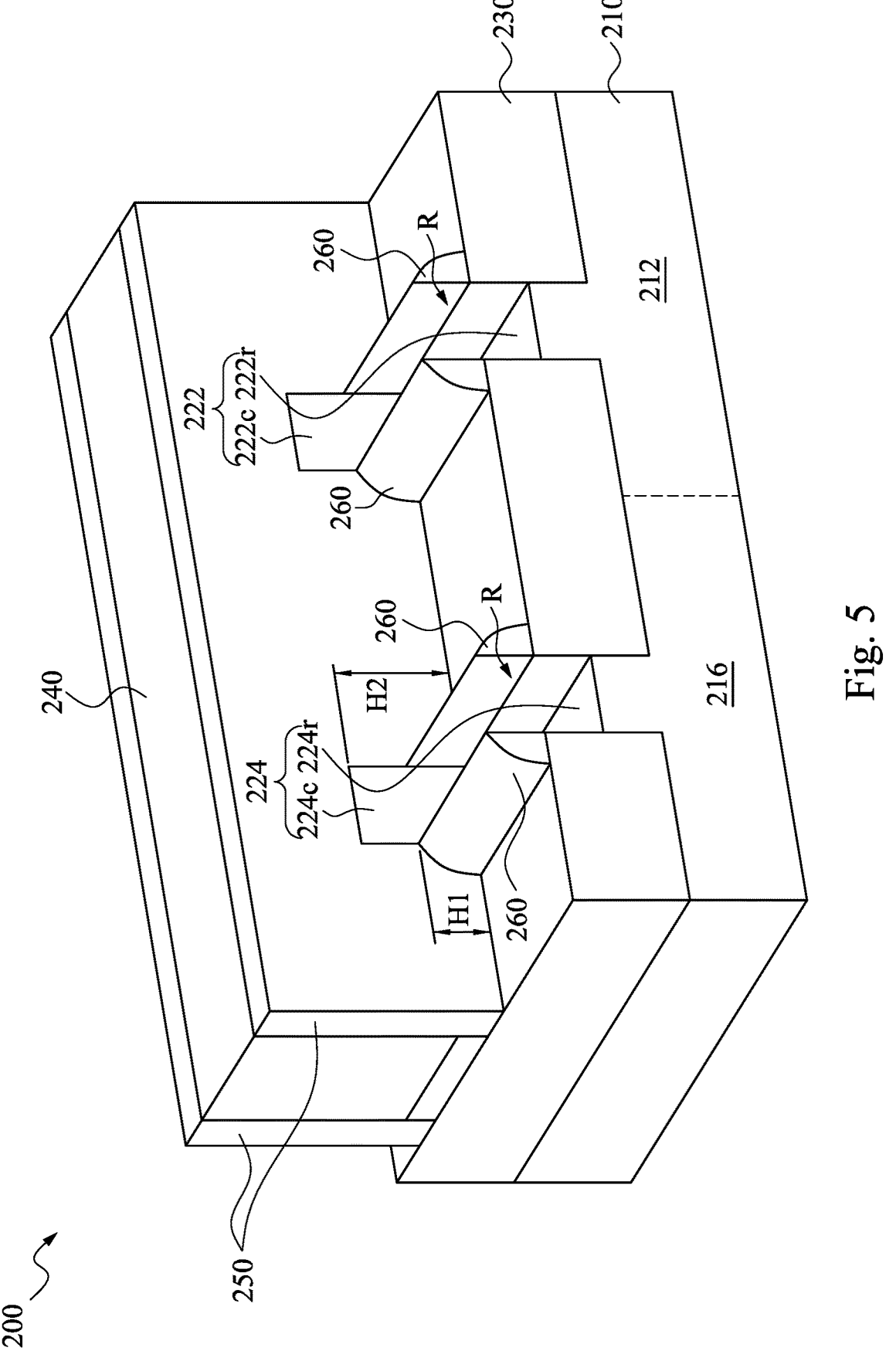

Reference is made to FIG. 5. A portion of the semiconductor fins 222, 224 exposed both by the dummy gate 240 and the gate spacers 250 are partially removed (or partially recessed) to form recesses R in the semiconductor fins 222, 224. In some embodiments, the recesses R are formed with the dielectric fin sidewall structures 260 as its upper portion. In some embodiments, sidewalls of the recesses R are substantially and vertical parallel to each other. In some other embodiments, the recesses R are formed with a non-vertical parallel profile.

In FIG. 5, the semiconductor fin 222 includes at least one recessed portion $222r$ and at least one channel portion $222c$. The recess R is formed on the recessed portion $222r$, and the dummy gate 240 covers the channel portion $222c$. The semiconductor fin 224 includes at least one recessed portion $224r$ and at least one channel portion $224c$. The recess R is formed on the recessed portion $224r$, and the dummy gate 240 covers the channel portion $224c$.

At least one of the dielectric fin sidewall structures 260 has a height H1, and at least one of the semiconductor fins 222, 224 has a height H2 protruding from the isolation structures 230 (i.e., the channel portions $222c$. $224c$). The height H1 is lower than the height H2. In some embodiments, the height H1 and the height H2 satisfies the condition: $0.1 \leq (H1/H2) \leq 0.5$, and the claimed scope is not limited in this respect. The height H1 of the dielectric fin sidewall structures 260 can be tuned, for example, by etching, to adjust the profile of the epitaxy structures 272 and 276 (see FIG. 6) formed thereon.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 6:
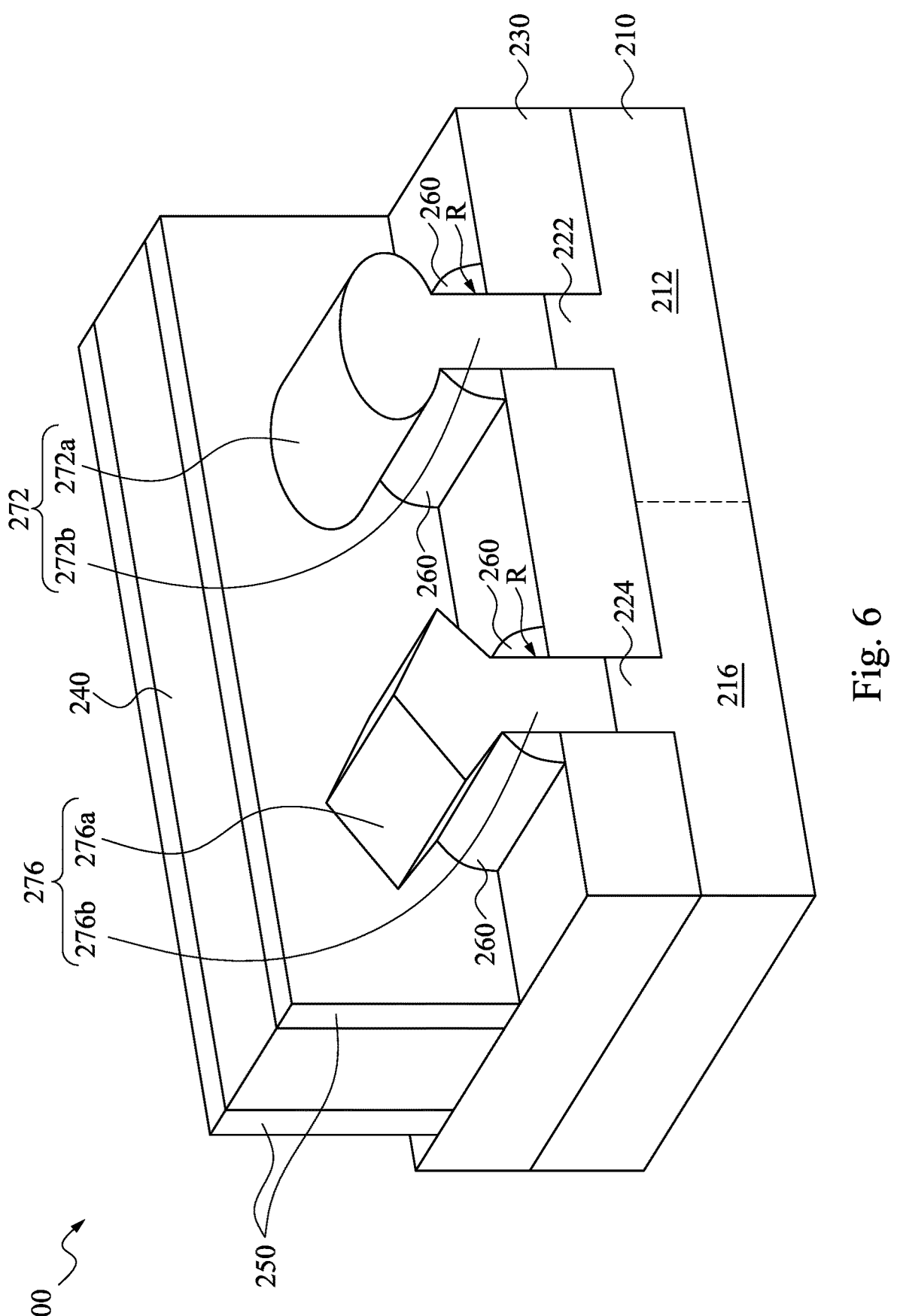

Reference is made to FIG. 6. A plurality of epitaxy structures 272 are respectively formed in the recesses R of the semiconductor fins 222, and a plurality of epitaxy structures 276 are respectively formed in the recesses R of the semiconductor fins 224. The epitaxy structure 272 is separated from the adjacent epitaxy structure 276. The epitaxy structures 272 and 276 protrude from the recesses R. The epitaxy structures 272 can be n-type epitaxy structures, and the epitaxy structures 276 can be p-type epitaxy structures. The epitaxy structures 272 and 276 may be formed using one or more epitaxy or epitaxial (epi) processes, such that Si features, SiGe features, and/or other suitable features can be formed in a crystalline state on the semiconductor fins 222, 224. In some embodiments, lattice constants of the epitaxy structures 272 and 276 are different from lattice constants of the semiconductor fins 222, 224, and the epitaxy structures 272 and 276 are strained or stressed to enable carrier mobility of the SRAM device and enhance the device performance. The epitaxy structures 272 and 276 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 272 and 276 are formed in different epitaxy processes. The epitaxy structures 272 may include SiP, SiC, SiPC, Si, III-V compound semiconductor materials or combinations thereof, and the epitaxy structures 276 may include SiGe, SiGeC, Ge, Si, III-V compound semiconductor materials, or combinations thereof. During the formation of the epitaxy structures 272, n-type impurities such as phosphorous or arsenic may be doped with the proceeding of the epitaxy. For example, when the epitaxy structure 272 includes SiC or Si, n-type impurities are doped. Moreover, during the formation of the epitaxy structures 276, p-type impurities such as boron or $BF_2$ may be doped with the proceeding of the epitaxy. For example, when the epitaxy structure 276 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 222, 224 (e.g., silicon). Thus, a strained channel can be achieved to increase carrier mobility and enhance device performance. The epitaxy structures 272 and 276 may be in-situ doped. If the epitaxy structures 272 and 276 are not in-situ doped, a second implantation process (i.e., a junction implant process) is performed to dope the epitaxy structures 272 and 276. One or more annealing processes may be performed to activate the epitaxy structures 272 and 276. The annealing processes include rapid thermal annealing (RTA) and/or laser annealing processes.

In some embodiments, the epitaxy structure 272 has a top portion 272a and a body portion 272b disposed between the top portion 272a and the substrate 210. The width of the top portion 272a is wider than the width of the body portion 270b. The dielectric fin sidewall structures 260 are disposed on opposite sides of the body portions 272b of the epitaxy structures 272, and the top portion 272a of the epitaxy structures 272 is disposed on the dielectric fin sidewall structures 260.

Moreover, the epitaxy structure 276 has a top portion 276a and a body portion 276b disposed between the top portion 276a and the substrate 210. The width of the top portion 276a is wider than the width of the body portion 276b. The dielectric fin sidewall structures 260 are disposed on opposite sides of the body portions 276b of the epitaxy structures 276, and the top portion 276a of the epitaxy structures 276 is disposed on the dielectric fin sidewall structures 260. The epitaxy structures 272 and 276 are utilized as source/drain regions of inverters.

In some embodiments, the epitaxy structures 272 and 276 have different shapes. The top portions 272a of the epitaxy structures 272 can have at least one substantially facet surface presented above the dielectric fin sidewall structures 260, and the top portions 276a of the epitaxy structures 276 can have at least one non-facet (or round) surface presented above the dielectric fin sidewall structures 260, and the claimed scope is not limited in this respect.

Figure 7:
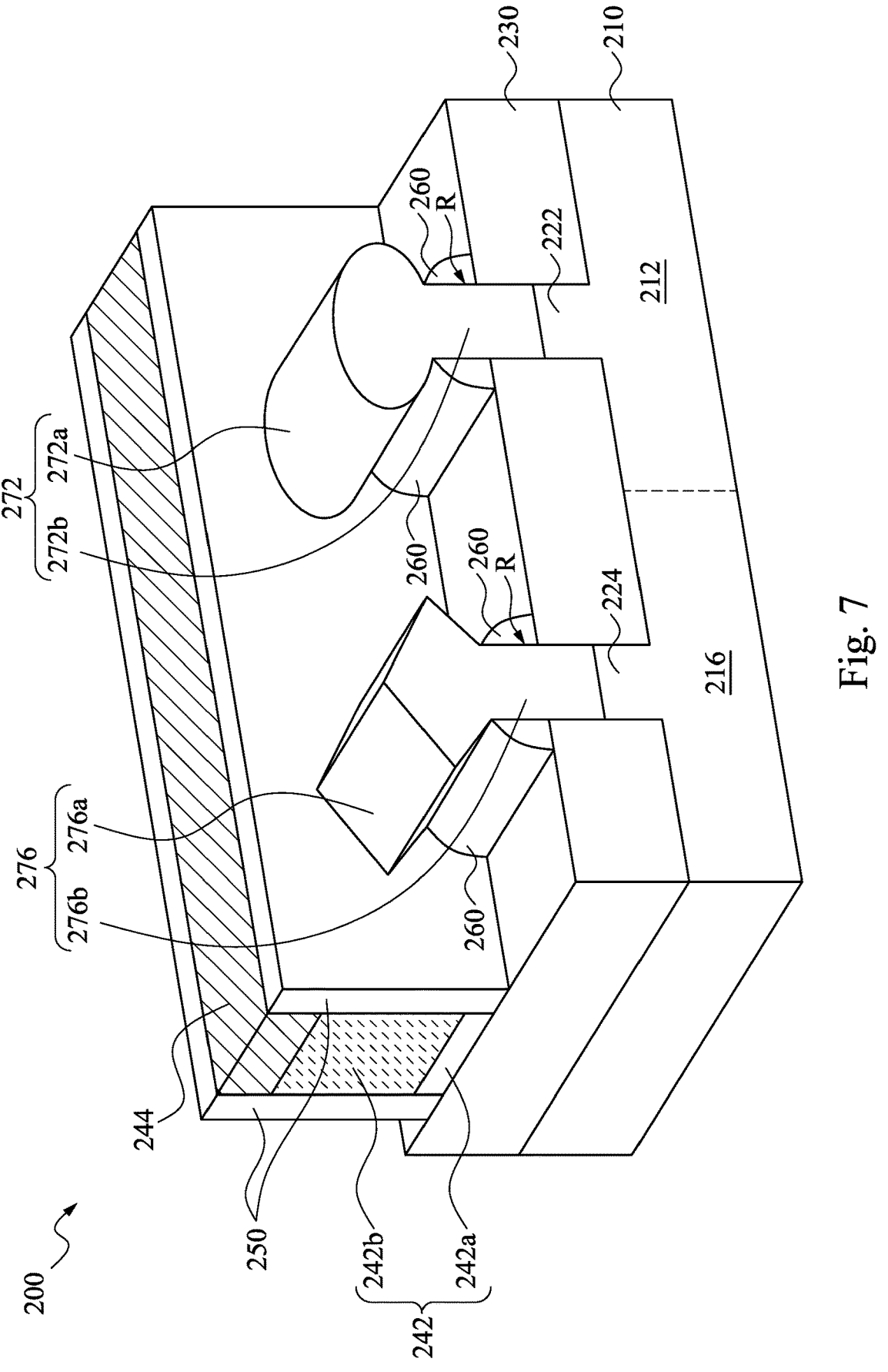

Reference is made to FIG. 7. After the epitaxy structures 272 and 276 are formed, the dummy gate 240 is removed and replaced by a gate stack 242. The dummy gate 240 can be removed by any suitable etching process thereby forming a trench between the gate spacer 250. The gate stack 242 is formed and fills the trench. In some embodiments, the gate stack 242 includes a gate insulator layer 242a and a gate electrode layer 242b. The gate insulator layer 242a is disposed between the gate electrode layer 241b and the substrate 210, and is formed on the semiconductor fins 222, 224. The gate insulator layer 242a, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 240a may have a multilayer structure such as one layer of silicon oxide (e.g., interfacial layer) and another layer of high-k material.

The gate insulator layer 242b may be formed using chemical vapor deposition (CVD), physical vapor deposition (PVD), atomic layer deposition (ALD), thermal oxide, ozone oxidation, other suitable processes, or combinations thereof. The gate electrode layers 242b are formed over the substrate 210 to cover the gate insulator layers 242a and the portions of the semiconductor fins 222, 224. The gate electrode layer 242b may be deposited doped or undoped. For example, in some embodiments, the gate electrode layer 242b includes polysilicon deposited undoped by low-pressure chemical vapor deposition (LPCVD). The polysilicon may also be deposited, for example, by furnace deposition of an in-situ doped polysilicon. Alternatively, the gate electrode layer 242b may include metals such as tungsten (W), nickel (Ni), aluminum (Al), tantalum (Ta), titanium (Ti), or any combination thereof. A cap layer 244 is further formed on the gate stack 242.

Figure 8:
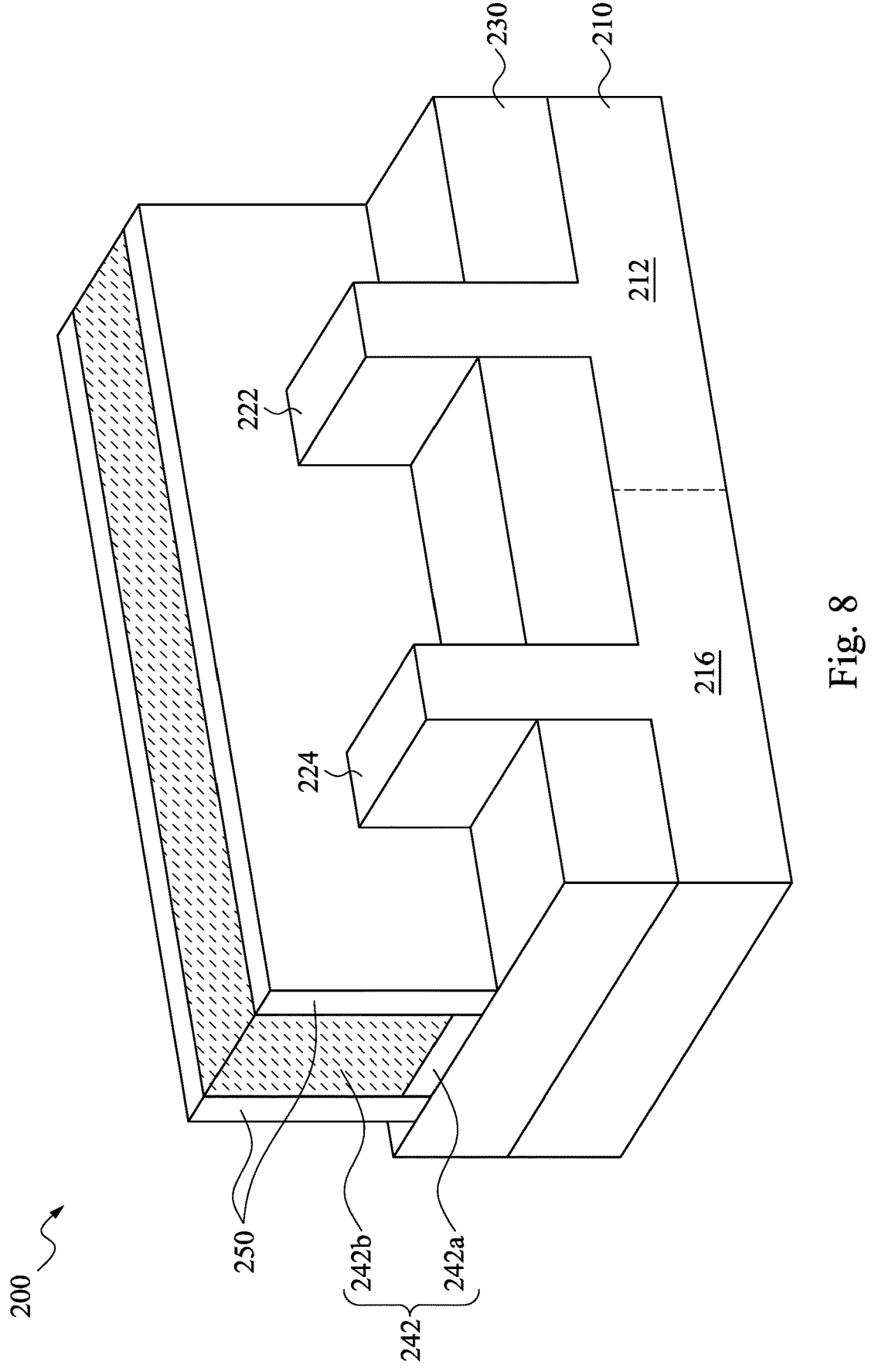
FIG. 8 is local perspective view of the FinFET component of some embodiments of the disclosure.

However, in some other embodiments, the FinFET component 200 may be fabricated by other suitable manufacturing processes, as shown in FIG. 8. The FinFET component 200 illustrated in FIG. 8 includes source/drain regions fabricated by doping the semiconductor fins 222, 224 instead of the epitaxy structures.

Figure 9:
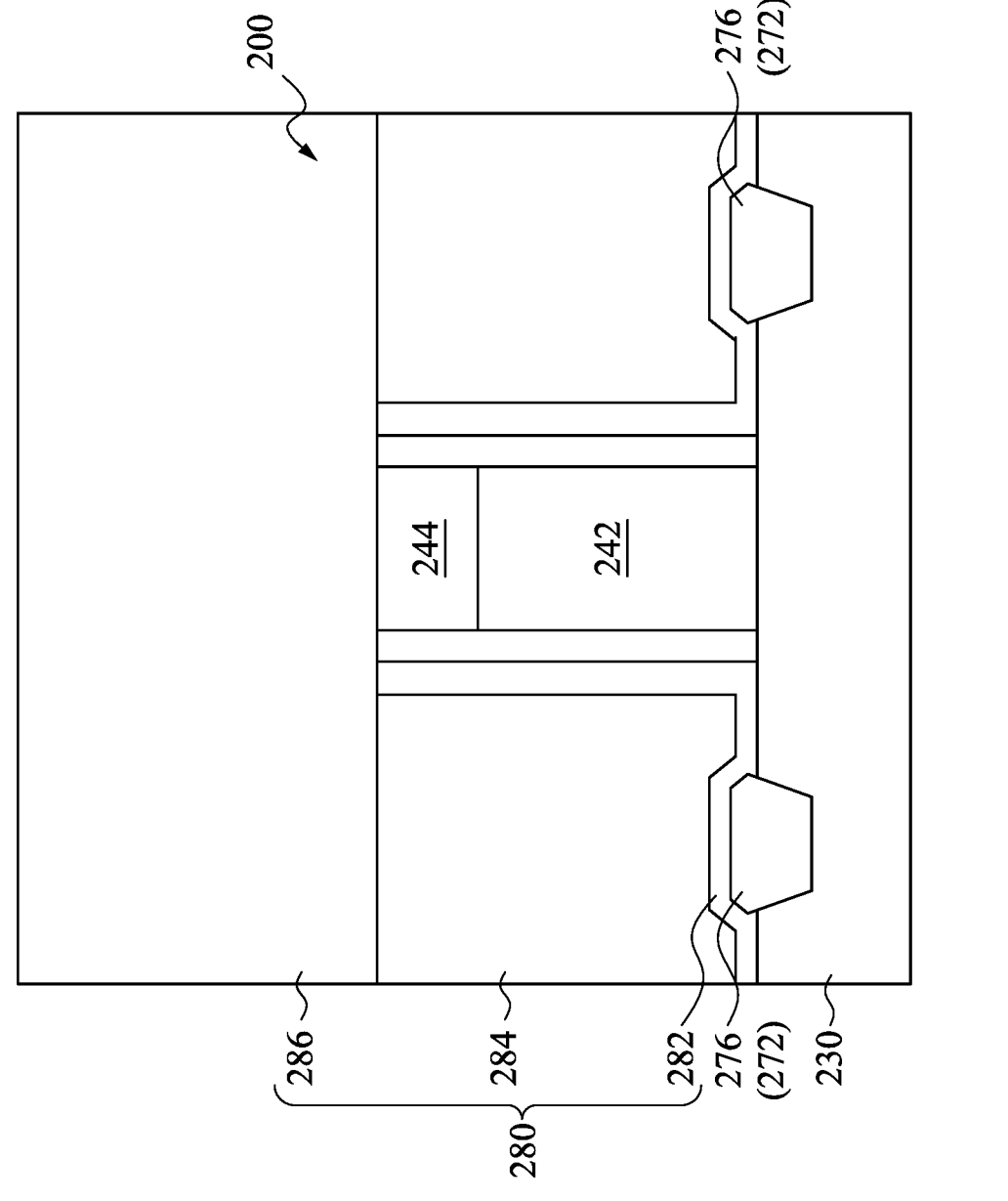
FIG. 9 is a schematic cross-sectional view of the FinFET component of the semiconductor device, in accordance with some embodiments of the disclosure.

Referring to FIG. 9, which is a schematic cross-sectional view of the FinFET component 200 of the semiconductor device 100, in accordance with some embodiments of the disclosure, in which FIG. 9 is taken along such as, line 9-9 in FIG. 1. After the FinFET component 200 is formed, a cap layer 244 is formed on the gate stack 242 for protecting the gate stack 242. The cap layer 244 can be formed by a suitable deposition process. The cap layer 244 can be a silicon nitride layer. A dielectric layer 280 is further formed on the FinFET component 200. The dielectric layer 280 may include a contact etch stop layer 282 and a plurality of dielectric layers 284, 286. A plurality of contacts, including vias and metal plugs, are further formed in the dielectric layer 280 for interconnecting the FinFET component 200 and other components. At least one of the contacts is electrically connected to the tuning component.

Reference is now made to FIG. 10 to FIG. 15. FIG. 10 to FIG. 15 illustrate different stages of a method for fabricating the tuning component 300 of the semiconductor device 100, in accordance with some embodiments of the disclosure, in which FIG. 10 to FIG. 15 are cross-sectional views taken along such as, line 10-10 of FIG. 1.

Figure 10:
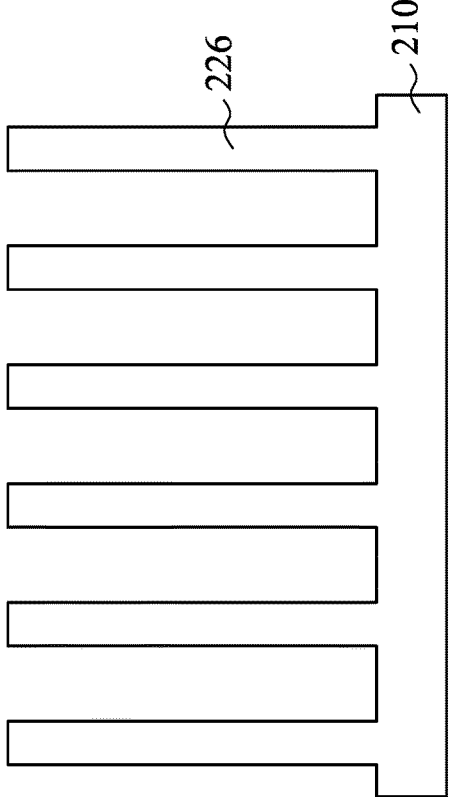

Reference is made to FIG. 10. The dummy semiconductor fins 226 are formed on the substrate 210. The dummy semiconductor fins 226 can be fabricated with the semiconductor fins 222, 224 (as shown in FIG. 2) by using substantially the same processes. The height of the dummy semiconductor fins 226 is same as that of the semiconductor fins 222, 224.

Figure 11:
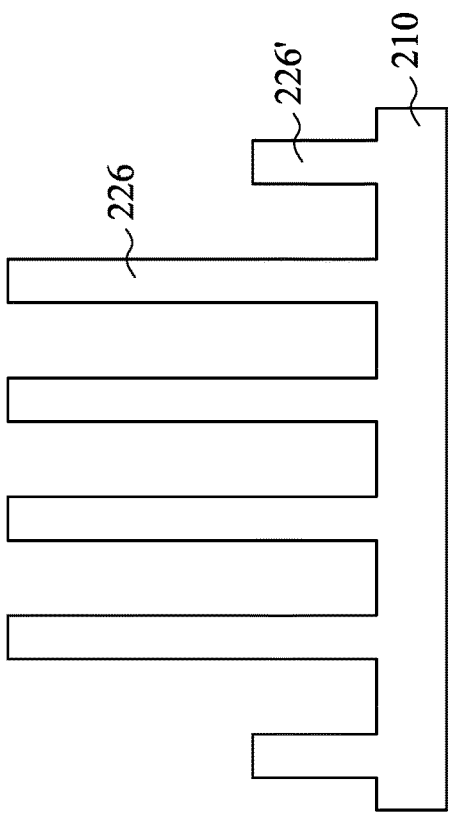
FIG. 10 to FIG. 15 illustrate different stages of a method for fabricating the tuning component of the semiconductor device, in accordance with some embodiments of the disclosure.

Reference is made to FIG. 11. Two of dummy semiconductor fins 226 are patterned and become patterned dummy semiconductor fins 226'. Plural dummy semiconductor fins 226 are existed between the patterned dummy semiconductor fins 226'.

Figure 12:
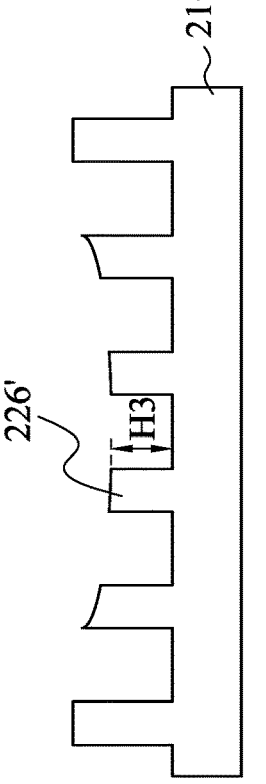

Reference is made to FIG. 12, the dummy semiconductor fins 226 between the patterned dummy semiconductor fins 226' are also patterned and become a series of patterned dummy semiconductor fins 226'. After the dummy semiconductor fins 226 are patterned, the height of the patterned dummy semiconductor fins 226' is shortened, thus the depth of the trenches between the patterned dummy semiconductor fins 226' is shortened accordingly. The aspect ratio of the trenches between the patterned dummy semiconductor fins 226' is reduced.

In some embodiments, the patterned dummy semiconductor fins 226' or at least some of the patterned dummy semiconductor fins 226' are located under the tuning component. Alternatively, the patterned dummy semiconductor fins 226' are located, or at least located under the tuning component. The dummy semiconductor fins 226 can be patterned by performing an etching process. For example, the dummy semiconductor fins 226 can be patterned by a dry etching process, thus patterned dummy semiconductor fins 226' form a concave top surface. The patterned dummy semiconductor fins 226' have a minimum height H3 at the center portion of the patterned dummy semiconductor fins 226'. Namely, the patterned dummy semiconductor fins 226' are shorter than the dummy semiconductor fins 226, and the patterned dummy semiconductor fins 226' at the center portion is shorter than the patterned dummy semiconductor fins 226' at the edge portion. The top surface of each of the patterned dummy semiconductor fins 226' is inclined toward the center portion of the patterned dummy semiconductor fins 226'. In some embodiments, the patterned dummy semiconductor fins 226' can be in a symmetry arrangement.

Figure 13:
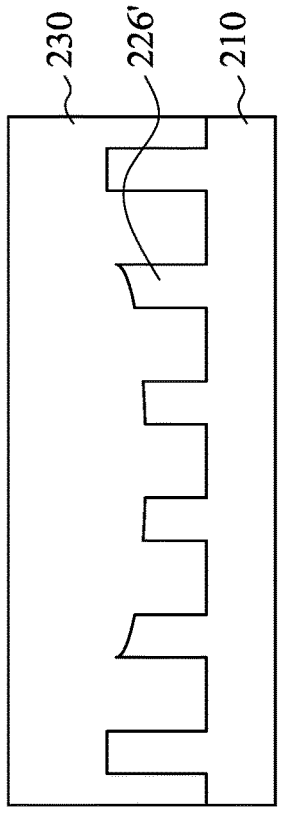

Reference is made to FIG. 13. An isolation structure 230 is formed on the substrate 210 and covers the patterned dummy semiconductor fins 226'. The patterned dummy semiconductor fins 226' are hidden in the isolation structure 230. The isolation structure 230 acts as a shallow trench isolation (STI). The isolation structure 230 is formed by chemical vapor deposition (CVD) techniques using tetra-ethyl-ortho-silicate (TEOS) and oxygen as a precursor. Because the top portion of the patterned dummy semiconductor fins 226' has been removed, the aspect ratio between the adjacent patterned dummy semiconductor fins 226' is lower than the dummy semiconductor fins 226 (see FIG. 10). Therefore, the filling of the isolation structure 230 at the patterned dummy semiconductor fins 226' is easier than filling the dummy semiconductor fins 226. Thus issues raised by failure filling can be prevented, and the quality of the isolation structure 230 acts as the shallow trench isolation can be improved accordingly.

Figure 14:
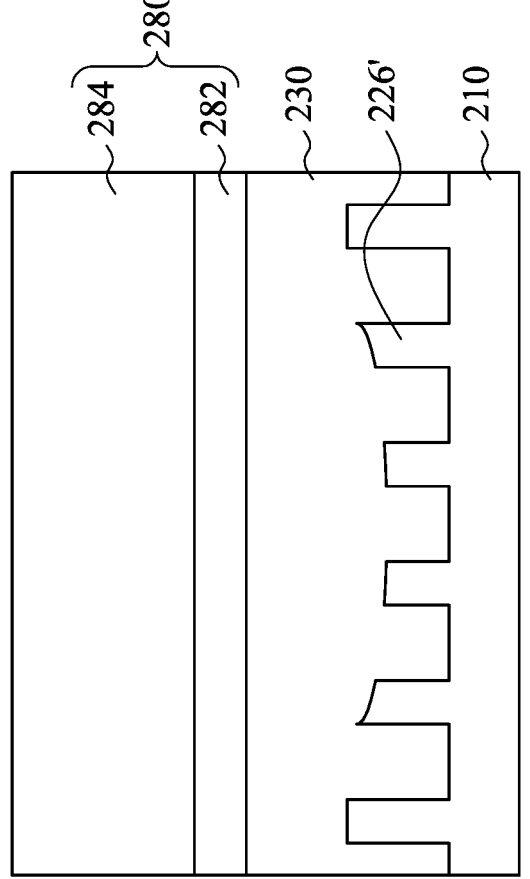

Reference is made to FIG. 14. At least one dielectric layer 280 is formed on the substrate 210. The dielectric layer 280 is formed on the isolation structures 230. The dielectric layer 280 includes at least one contact etch stop layer 282 and the at least one inter layer dielectric layer 284. The contact etch stop layer 282 is formed between the inter layer dielectric layer 284 and the isolation structure 230. The contact etch stop layer 282 and the inter layer dielectric layer 284 are formed by performing a plurality of deposition process. The contact etch stop layer 282 is a silicon nitride layer, and the inter layer dielectric layer 284 can be an oxide layer.

Figures 15, 16:
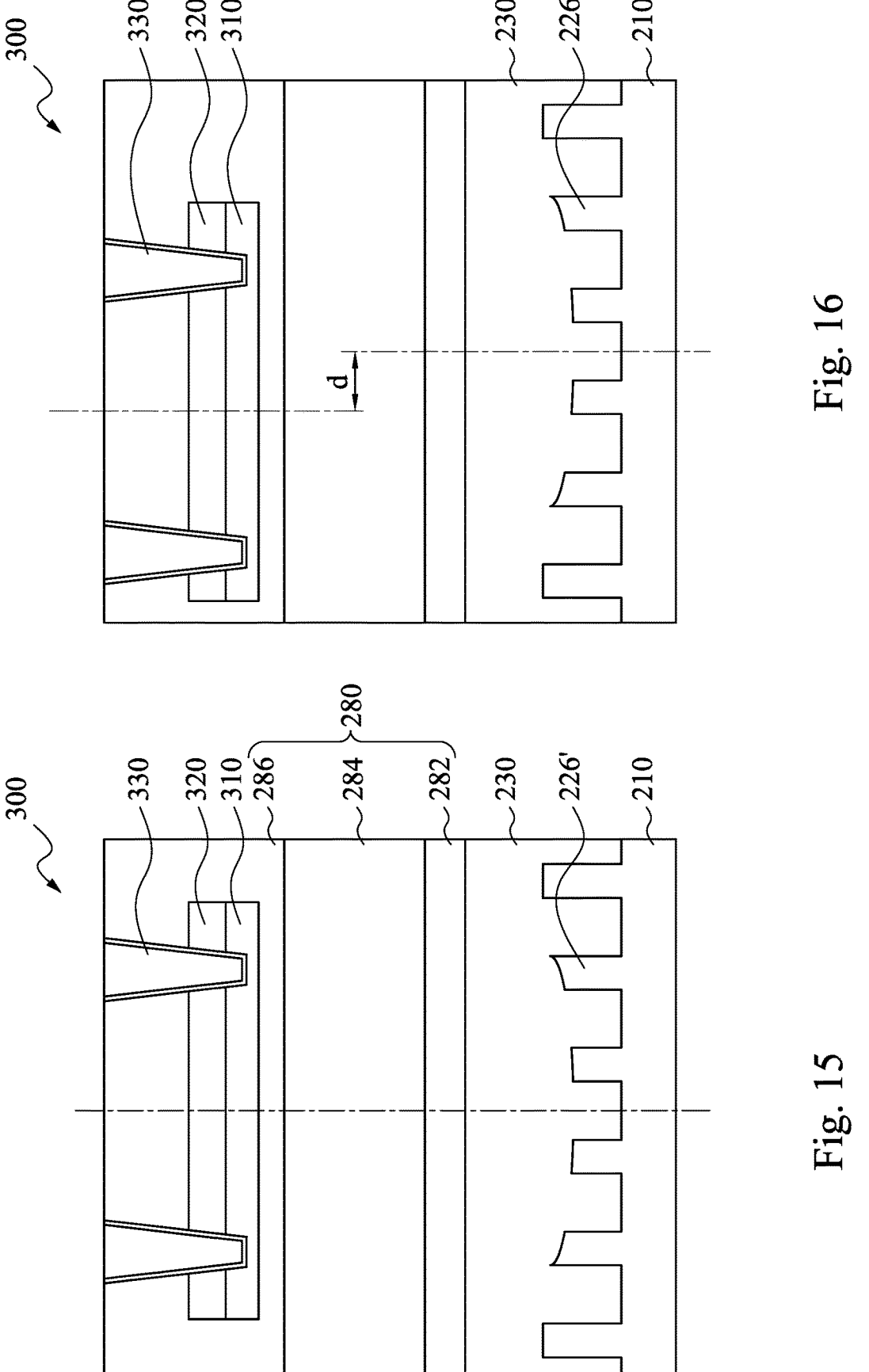
FIG. 16 is a cross-sectional view of the tuning component of the semiconductor device, in accordance with some embodiments of the disclosure.

Reference is made to FIG. 15. Another interlayer dielectric layer 286 is formed on the inter layer dielectric layer 284. The tuning component 300 is formed in the inter layer dielectric layer 286, and the tuning component 300 is disposed above the patterned dummy semiconductor fins 226'. The tuning component includes a tuning layer 310, and a hard mask layer 320 formed on the high-resistance layer 310. The tuning layer 310 is a high-resistance layer, such as a metal nitride layer. In some embodiments, the tuning layer 310 is a titanium nitride layer. The hard mask layer 320 is a nitride layer, such as a silicon nitride layer. The tuning layer 310 and the hard mask layer 320 are formed by a plurality of suitable deposition and etching processes. In some embodiments, the hard mask layer 320 is thicker than the tuning layer 310. The tuning component 300 further includes a plurality of contacts 330. The contacts 330 are formed penetrating the inter layer dielectric layer 286 and the hard mask layer 320 and are connected to the tuning layer 310. The contacts 330 may electrically connected to the FinFET component 200 through interconnection structures. The tuning component 300 is at least electrically connected to the FinFET component for 200 tuning the electric current and the threshold voltage of the semiconductor device 100. By properly modifying the thickness, the material, and the size of the tuning layer 310, the electric current and the threshold voltage of the semiconductor device 100 can be tuned as desirable.

The tuning component 300 is disposed above the patterned dummy semiconductor fins 226'. The tuning component 300 and the patterned dummy semiconductor fins 226' are symmetry arranged, i.e., the tuning component 300 and the patterned dummy semiconductor fins 226' share the same axle. In some other embodiments, the tuning component 300 and the patterned dummy semiconductor fins 226' are asymmetry arranged, i.e., an offset d is present between the axles of the tuning component 300 and the patterned dummy semiconductor fins 226', as shown in FIG. 16.

The tuning component is at least electrically connected to the FinFET component for tuning the electric current and the threshold voltage of the semiconductor device. By patterning the dummy semiconductor fins under the tuning component, the depth and the aspect ratio of the trenches therebetween are reduced. The dielectric filling of forming the isolation structure becomes easy, and the issues caused by failure filling can be prevented.

According to some embodiments of the disclosure, a semiconductor device includes a FinFET component, a plurality of patterned dummy semiconductor fins arranged aside a plurality of fins of the FinFET component, an isolation structure formed on the patterned dummy semiconductor fins, and a tuning component formed on the patterned dummy semiconductor fins and electrically connected to the FinFET component. A height of the patterned dummy semiconductor fins is shorter than that of the fins of the FinFET component.

According to some embodiments of the disclosure, a semiconductor device includes a substrate, a plurality of dummy semiconductor fins formed on the substrate, wherein the dummy semiconductor fins form a concave top surface, an isolation structure filling a plurality of trenches between the dummy semiconductor fins, and a component disposed on the dummy semiconductor fins.

According to some embodiments of the disclosure, a method of fabricating a semiconductor device is provided. The method includes forming a plurality of semiconductor fins and a plurality of dummy semiconductor fins on the substrate; patterning the dummy semiconductor fins, such that the patterned dummy semiconductor fins are shorter than the semiconductor fins; forming an isolation structure on the patterned dummy semiconductor fins; forming a FinFET component comprising the semiconductor fins on the substrate; and forming a tuning component on the isolation structure and above the patterned dummy semiconductor fins.

According to some embodiments of the disclosure, a method includes forming a plurality of active semiconductor fins and a plurality of dummy semiconductor fins on a substrate. The plurality of dummy semiconductor fins are patterned to form a plurality of patterned dummy semiconductor fins. The plurality of patterned dummy semiconductor fins are shorter than the plurality of active semiconductor fins. An isolation structure is formed on the plurality of patterned dummy semiconductor fins. A FinFET component is formed. The FinFET component includes the plurality of active semiconductor fins on the substrate. A tuning component is formed on the isolation structure and above the plurality of patterned dummy semiconductor fins.

According to some embodiments of the disclosure, a method includes patterning a substrate to form active semiconductor fins and dummy semiconductor fins. The dummy semiconductor fins are recessed to form recessed dummy semiconductor fins. At least one of the recessed dummy semiconductor fins has a concave top surface. An insulating layer is formed over the recessed dummy semiconductor fins and between adjacent active semiconductor fins. A gate stack is formed along topmost surfaces and sidewalls of the active semiconductor fins. A tuning layer is formed over the recessed dummy semiconductor fins. The insulating layer is interposed between the tuning layer and the recessed dummy semiconductor fins.

According to some embodiments of the disclosure, a method includes etching a substrate to form a plurality of trenches in the substrate. Portions of the substrate between adjacent trenches form active semiconductor fins and dummy semiconductor fins adjacent the active semiconductor fins. The dummy semiconductor fins are recessed to form recessed dummy semiconductor fins. The recessed dummy semiconductor fins have non-uniform heights. An insulating material is formed in the plurality of trenches. A topmost surface of the insulating material is above topmost surfaces of the recessed dummy semiconductor fins and below topmost surfaces of the active semiconductor fins. A gate stack is formed along the topmost surfaces and sidewalls of the active semiconductor fins. A dielectric layer is formed over the insulating material above the recessed dummy semiconductor fins. A tuning layer is formed over the dielectric layer.

According to some embodiments of the disclosure, a semiconductor device includes a FinFET component including a plurality of active fins and a tuning component adjacent the FinFET component. The tuning component includes a plurality of dummy fins and an isolation structure over the plurality of dummy fins. The plurality of dummy fins are shorter than the plurality of active fins. The plurality of dummy fins have non-uniform heights.

According to some embodiments of the disclosure, a semiconductor device includes a FinFET component and a tuning component adjacent the FinFET component. The FinFET component includes a plurality of active fins and a gate stack overlapping with the plurality of active fins in a plan view. The tuning component incudes a plurality of dummy fins and an isolation structure in physical contact with sidewalls and top surfaces of the plurality of dummy fins. The plurality of dummy fins are shorter than the plurality of active fins. A first dummy fin of the plurality of dummy fins has a planar top surface. A second dummy fin of the plurality of dummy fins has a concave top surface.

According to some embodiments of the disclosure, a semiconductor device includes a FinFET component and a tuning component adjacent the FinFET component. The FinFET component includes a plurality of active fins, a first portion of an insulating layer between adjacent active fins of the plurality of active fins, top surfaces of the plurality of active fins being above a top surface of the insulating layer, and a gate stack over the insulating layer and extending along sidewalls and the top surfaces of the plurality of active fins. The tuning component includes a plurality of dummy fins and a second portion of the insulating layer covering the plurality of dummy fins. The plurality of dummy fins are shorter than the plurality of active fins. Top surfaces of the plurality of dummy fins have different curvatures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a FinFET component comprising a plurality of active fins;
   a plurality of dummy fins, wherein the plurality of dummy fins are shorter than the plurality of active fins, and wherein the plurality of dummy fins have non-uniform heights, wherein a first dummy fin of the plurality of dummy fins has a concave surface, wherein a first sidewall of the first dummy fin is longer than a second sidewall of the first dummy fin, wherein a first pitch of the plurality of active fins is equal to a second pitch of the plurality of dummy fins;
   an isolation structure over the plurality of dummy fins; and
   a tuning component adjacent the FinFET component, the tuning component comprising a tuning layer over the isolation structure, wherein the tuning layer is vertically above the plurality of dummy fins along a line perpendicular to an upper surface of the isolation structure.

2. The semiconductor device of claim 1, wherein the FinFET component further comprises a gate stack extending along sidewalls and top surfaces of the plurality of active fins.

3. The semiconductor device of claim 1, wherein the plurality of active fins extend through the isolation structure, top surfaces of the plurality of active fins being above a top surface of the isolation structure.

4. The semiconductor device of claim 1, wherein the tuning component further comprises a hard mask layer over the tuning layer.

5. The semiconductor device of claim 4, wherein the tuning component further comprises a conductive feature, the conductive feature extending through the hard mask layer and into the tuning layer.

6. The semiconductor device of claim 1, further comprising a dielectric layer over the isolation structure, the dielectric layer being between the tuning component and the isolation structure.

7. The semiconductor device of claim 1, wherein a center of the tuning component is laterally offset from a center of the plurality of dummy fins in a cross-sectional view.

8. A semiconductor device comprising:
   a FinFET component comprising:
      a plurality of active fins; and
      a gate stack overlapping with the plurality of active fins in a plan view, the gate stack comprising a gate electrode and a gate spacer adjacent the gate electrode;
   a plurality of dummy fins, wherein the plurality of dummy fins are shorter than the plurality of active fins, wherein a first dummy fin of the plurality of dummy fins has a planar top surface, and wherein a second dummy fin of the plurality of dummy fins has a concave top surface, wherein a first sidewall of the second dummy fin is longer than a second sidewall of the second dummy fin, the first sidewall facing the plurality of active fins, wherein the plurality of active fins and the plurality of dummy fins have a uniform pitch;
   an isolation structure in physical contact with sidewalls and top surfaces of the plurality of dummy fins;
   a first dielectric layer over the isolation structure and laterally adjacent the FinFET component, an upper surface of the first dielectric layer being level with an upper surface of the gate spacer;
   a second dielectric layer over and contacting the first dielectric layer; and
   a tuning component in the second dielectric layer electrically coupled to the FinFET component, the tuning component comprising a high-resistance layer vertically over the plurality of dummy fins along a line perpendicular to an upper surface of the first dielectric layer.

9. The semiconductor device of claim 8, wherein the tuning component further comprises:
   a hard mask layer over the high-resistance layer.

10. The semiconductor device of claim 9, wherein a thickness of the hard mask layer is greater than a thickness of the high-resistance layer.

11. The semiconductor device of claim 9, wherein the tuning component further comprises a conductive feature, the conductive feature being in physical contact with the hard mask layer and the high-resistance layer.

12. The semiconductor device of claim 8, wherein the first dummy fin and the second dummy fin have different heights.

13. The semiconductor device of claim 8, wherein a center of the tuning component is laterally offset from a center of the plurality of dummy fins in a cross-sectional view.

14. A semiconductor device comprising:
   a FinFET component comprising:
      a plurality of active fins;
      a first portion of a first insulating layer between adjacent active fins of the plurality of active fins, top surfaces of the plurality of active fins being above a top surface of the first insulating layer; and
      a gate stack over the first insulating layer and extending along sidewalls and the top surfaces of the plurality of active fins;
   a plurality of dummy fins, wherein the plurality of dummy fins are shorter than the plurality of active fins, and wherein top surfaces of the plurality of dummy fins have different curvatures, wherein the plurality of active fins and the plurality of dummy fins have a same pitch, wherein a first sidewall of a first dummy fin of the plurality of dummy fins is longer than a second sidewall of the first dummy fin;
   a second portion of the first insulating layer covering the plurality of dummy fins;
   a second insulating layer over the first insulating layer, wherein an upper surface of the second insulating layer is level with an upper surface of the gate stack; and
   a tuning component over the second insulating layer, wherein the tuning component overlaps the plurality of dummy fins in a top down view.

15. The semiconductor device of claim 14, wherein the tuning component further comprises:
   a tuning layer over the second insulating layer; and
   a hard mask layer over the tuning layer.

16. The semiconductor device of claim 15, wherein the tuning layer comprises a titanium nitride layer.

17. The semiconductor device of claim 14, wherein the plurality of dummy fins have different heights.

18. The semiconductor device of claim 14, wherein the tuning component only partially overlaps a second dummy fin of the plurality of dummy fins.

19. The semiconductor device of claim 14, wherein a center of the tuning component is laterally offset from a center of the plurality of dummy fins in a cross-sectional view.

20. The semiconductor device of claim 14, wherein a center of the tuning component is aligned with a center of the plurality of dummy fins in a cross-sectional view.

* * * * *